(12) United States Patent
Wohlrab et al.

(10) Patent No.: US 11,543,441 B2
(45) Date of Patent: Jan. 3, 2023

(54) ENERGY METERING TERMINAL OR MEASURING CIRCUIT OF AN ENERGY METERING TERMINAL

(71) Applicant: Turck Holding GmbH, Halver (DE)

(72) Inventors: Jürgen Daniel Wohlrab, Thum (DE); Wolfgang Dieter Weigel, Lichtenstein (DE); Thomas Hartisch, Grünhain-Beierfeld (DE)

(73) Assignee: Turck Holding GmbH, Halver (DE)

( * ) Notice: Subject to any disclaimer, the term of this patent is extended or adjusted under 35 U.S.C. 154(b) by 0 days.

(21) Appl. No.: 17/340,617

(22) Filed: Jun. 7, 2021

(65) Prior Publication Data

US 2021/0382095 A1    Dec. 9, 2021

(30) Foreign Application Priority Data

Jun. 8, 2020   (DE) .......................... 102020115180.2

(51) Int. Cl.
*G01R 21/06* (2006.01)
*G01R 15/18* (2006.01)

(52) U.S. Cl.
CPC ............. *G01R 21/06* (2013.01); *G01R 15/18* (2013.01)

(58) Field of Classification Search
CPC ........ G01R 21/06; G01R 15/18; G01R 15/09; G01R 22/063; G01R 15/08; G01R 15/002; G01R 1/04
USPC ...................................................... 324/127
See application file for complete search history.

(56) References Cited

U.S. PATENT DOCUMENTS

| 7,397,234 | B2 * | 7/2008 | Alfano ................. G01R 15/181 324/126 |
| 9,369,052 | B1 * | 6/2016 | Morong ................... H01F 27/29 |
| 9,910,101 | B2 | 3/2018 | Lee et al. |

FOREIGN PATENT DOCUMENTS

| DE | 1812255 A1 | 6/1970 |
| DE | 2527392 A1 | 12/1976 |
| EP | 3393042 A1 | 10/2018 |
| EP | 3392664 B1 | 2/2020 |
| WO | 2014058728 A1 | 4/2014 |

* cited by examiner

*Primary Examiner* — Tung X Nguyen
*Assistant Examiner* — Robert P Alejnikov, Jr.
(74) *Attorney, Agent, or Firm* — Whitmyer IP Group LLC

(57) ABSTRACT

A measuring circuit for determining the magnitude of a current flowing through a conductor, the measuring circuit having an input terminal pair that can be connected to the current transformer with a first switch, which connects a measuring resistor between the input terminals in a current measuring position, and which, in a voltage measuring position, separates the measuring resistor from at least one of the input terminals, and having an output terminal pair, at which, alternatively, a voltage-dependent measuring voltage present at the input terminal pair or a current-dependent measuring voltage present at a first measuring point of the measuring resistor can be tapped. The measuring circuit includes a changeover switch which can be switched synchronously with the switch. The changeover switch is used to connect an output terminal to the first measuring point in the current measuring position, and to the second measuring point in the voltage measuring position.

9 Claims, 2 Drawing Sheets

ENERGY METERING TERMINAL OR MEASURING CIRCUIT OF AN ENERGY METERING TERMINAL

TECHNICAL FIELD

The invention relates to a measuring circuit that can be connected to a current transformer to determine the magnitude of a current flowing through a conductor, the measuring circuit having an input terminal pair that can be connected to the current transformer, with a first switch, which connects a measuring resistor between the input terminals in a current measuring position, and which, in a voltage measuring position, separates the measuring resistor from at least one of the input terminals. The measuring circuit has an output terminal pair, at which, alternatively, a voltage-dependent measuring voltage present at the input terminal pair or a current-dependent measuring voltage present at a first measuring point of the measuring resistor can be tapped.

The invention furthermore relates to an energy metering terminal having such a measuring circuit.

BACKGROUND

EP 3 392 664 B1 describes a measuring circuit comprising two output terminals of a current transformer, at which either a voltage is present or from which a current is supplied. The measuring circuit can be connected to a power measuring device, which measures the voltage applied to a power supply line by means of a voltage transformer, and which measures the current flowing through the power supply line by means of the measuring circuit. If a transformer is connected to an energized line as a current transformer, a current proportional to the current flowing through the energized line is generated, which is converted by the measuring circuit into a voltage proportional to the current. For this purpose, a measuring resistor is connected between the output terminals of the current transformer via a switch. The voltage drop across the measuring resistor is a measure of the current and is measured by a voltage measuring device. If, for example, a Rogowski coil is placed around an energized line as a current transformer, this current transformer supplies a voltage proportional to the current flowing through the energized line. To measure this voltage, the switch is opened such that the voltage can be measured directly by the voltage measuring device.

The prior art also includes EP 3 393 042 A1, DE 1 812 255 A1, WO 2014/058728 A1, WO 99/57578 A1 and DE 2 527 392 A1.

SUMMARY

The objective underlying the invention is to advantageously refine a generic measuring circuit or a generic energy metering terminal. In particular, another objective underlying the invention is to specify a configurable measuring circuit which can use both output currents and output voltages as input signals. In particular, another objective underlying the invention is to specify a measuring circuit which works without additional power supplied from the grid to be measured. In particular, another objective underlying the invention is to specify a generic measuring circuit which is a circuit of low complexity. In particular, another objective underlying the invention is to increase the accuracy of the measuring circuit.

The objectives are solved by the invention specified in the claims, wherein the dependent claims represent not only advantageous refinements of the invention specified in the independent claims, but also independent solutions of the problem.

While the generic prior art performs a current measurement by measuring the voltage drop across the switch wired in series with the measuring resistor and the measuring resistor, the invention proposes that the switch is arranged in such a way that the two input terminals of a voltage measuring device can be directly connected in an electrically conductive manner to the measuring resistor via a changeover switch. Therein, the input terminals of the voltage measuring device are connected either directly or via a filter to the output terminals of the measuring circuit. The filter can be used to filter out high-frequency interference signals. The filter positioned between the voltage measuring device and the measuring resistor is preferably a single-stage or multi-stage low-pass filter. The changeover switch can be coupled with the switch which brings the measuring resistor into a current flow connection with the output terminals of the current transformer. The changeover switch can be synchronized with the switch. The changeover switch can connect an input terminal of the voltage measuring device or of the filter upstream of it, either to a node between the switch and the measuring resistor or to the output terminal of the current transformer, which output terminal is preferably connected to a terminal of the switch. If the switch is in a blocking state, such that no current flows through the measuring resistor, the voltage supplied by the current transformer is applied to a contact of the changeover switch, which is brought into a conductive connection with the output terminal of the measuring circuit or the input terminal of the voltage measuring device. If, on the other hand, the switch is conductive, a current flows through the switch and the measuring resistor. The two terminals of the measuring resistor are then connected to the voltage measuring device via the changeover switch, which at that point has been switched over, such that the voltage drop across the measuring resistor can be measured. The changeover switch can connect an output terminal of the measuring circuit either to a measuring point of the measuring resistor for measuring current or to a measuring point for measuring voltage, wherein the latter measuring point is at the potential of the input terminal. In a refinement of the invention, a circuit assembly, which consists of a second switch and a second measuring resistance, and which is identical to the circuit assembly comprising the first switch and the first measuring resistor, is connected in parallel with the latter assembly, wherein the two circuit assemblies essentially only differ in the resistance value of the respective measuring resistors, such that such a circuit arrangement can cover two measuring ranges. Further such circuit assemblies can cover additional measuring ranges. Each of these circuit assemblies has a connection node between the measuring resistor and the switch, which forms a measuring point, which by means of the changeover switch can be brought into a conductive connection either to the input terminal of the voltage measuring device or to the output terminal of the measuring circuit. The first or second switch is thus connected to the output terminal of the current transformer by a first terminal and to the connection node by a second terminal. When operating the measuring circuit, the first and second switches are switched simultaneously with the changeover switch. A third switch is proposed in a refinement of the invention. This third switch can connect the changeover switch to the output terminal of the current transformer. In a preferred design, the third switch connects the two output terminals of the current transformer or the input terminals of the measuring circuit to a capacitor. The capacitor has such a low capacitance that it only shorts high alternating currents and does not affect the measurement result of the measuring circuit when measuring low-frequency currents of 50 Hz or 60 Hz, for example. The changeover switch has a common contact which is connected to an output terminal, to the filter or to the voltage measuring device. This common contact can alternatively be electrically connected to switching contacts, wherein the number of electric switching contacts corresponds to the number of switches by means of which either a measuring resistor or a capacitor can be connected to the output terminals of the current transformer. In a refinement of the invention, which also has independent character, the switches are, or at least one of the switches is, designed as (an) electrically actuable switch(es). The changeover switch can also be an electrically actuable switch. The switches and the changeover switch can be semiconductor switches. Principally, the switches and the changeover switch can also be designed from electromechanical components, for example relays. Preferably, at least the switches are designed as MOSFETs. The measuring resistors preferably have such low resistance values that the current flowing through them, which can be up to 1 A or up to 5 A, depending on the circuit, causes a voltage drop at the body diode of the MOSFET, which is less than the forward voltage of the body diode, for example less than 0.7 V. On the one hand, it can be the MOSFET which is connected in series with the measuring resistor. If multiple MOSFETs connected in series with a measuring resistor are connected in parallel, all measuring resistors are preferably dimensioned such that in each operating state the voltage drop across a channel resistance of one of the MOSFETs is less than the forward voltage of the body diode representing the channel. This eliminates the need to connect two anti-serial N-channel MOSFETs, as is the case in the aforementioned prior art. By reducing the voltage drop across the MOSFET or across the measuring resistor, the MOSFET is sufficient for measuring alternating currents. A refinement of the invention may include the aforementioned single-stage or multi-stage low-pass filter and/or a surge protection circuit. The surge protection circuit essentially cuts off voltage peaks supplied by the current transformer. A circuit having particularly few components has only one switch and a changeover switch which can connect a common contact with two switching contacts. One of the two switching contacts is connected to a node between the switch and the measuring resistor, and the other of the two switching contacts is connected to the output terminal of the current transformer. The latter switching contact can also additionally be connected to the other output terminal of the current transformer via a capacitor. Here, too, the changeover switch and switch are switched synchronously. In a refinement of the invention, two measuring resistors may be connected in series with each other and together be connected in series with the switch. The current or voltage signal of the current transformer can either be connected to the two measuring resistors via the switch or by selecting the input terminals of the measuring circuit with a connecting line to the node between the two measuring resistors. Various measuring ranges can be set by such a change in the circuit. For example, a measuring current, which can be up to 1 A, can flow through both measuring resistors via the conductive switch, or a measuring current, which can be up to 5 A, can only flow through one of the two measuring resistors. The voltage drop at the measuring resistor through which the current flows is then measured via the other measuring resistor when the switch is in a blocking state.

A measurement circuit designed according to the previously described variants is used in an energy metering terminal according to the invention. The term 'energy metering terminal' is used in the context of this disclosure to describe any device or apparatus which can be used to measure a current flowing through a conductor, or the power transmitted by the conductor. The energy metering terminal has a plurality of connection contacts that can be placed in an electrically conductive connection with a voltage transformer and a current transformer. The current transformer supplies a voltage in the manner described above, wherein the voltage is proportional to a current flowing through an energized line, for example, one of three phases of a three-phase line. This voltage periodically oscillates with the mains frequency. The voltage transformer is used to measure the voltage between, for example, a neutral conductor and one of the three phases. This voltage also oscillates periodically with the mains frequency. The two oscillating signals can be phase-shifted. The amplitude of the signals and the phase shift are measured with a measuring transducer having a voltage measuring device. The measuring transducer converts these signals into information about the current power, in particular apparent power and active power, and into phase information. The voltage transformer can have one or more voltage dividers, at which the measuring transducer taps a voltage proportional to the voltage between the phase and the neutral conductor. The energy metering terminal can also have a control circuit. This control circuit can be used to actuate the switch or the changeover switch. In addition, a communication interface has shown to be advantageous, by means of which the values obtained by the measuring transducer are transmitted to peripherals as digital values. The device according to the invention can be used to measure current and voltage in single-phase and/or multi-phase electric AC power grids. Electrical values such as power, energy, phase shift and power factor can be calculated from the measured values obtained therein. The device makes it possible to analyze electric networks as well as consumers. The electric conductors are connected to the device directly or via a voltage transformer for measuring voltage. The electrical currents of the phases and, if applicable, also the electrical current of the neutral conductor are transmitted to the device via current transformers in a galvanically isolated manner, and in the process are reduced to the maximum permissible current or voltage values for the device. Current transformers can work according to the transformer principle, which act as a power source at the output. However, the current transformers can also work according to the induction principle, for example as Rogowski coils, which act as a voltage source at the output. The configuration via the switches can be done automatically via the control circuit, for example by first measuring a voltage at non-conductive switches. If this voltage exceeds an upper limit, the system switches to current measurement. However, it is also possible to first measure the voltage drop across one of the resistors, to switch to voltage measurement when said voltage falls below a limit. The surge protection circuit ensures that the voltage present at the voltage measuring device does not rise too high in the case of a current-supplying current transformer. The analog input circuit thus provides a measuring voltage for an integrated energy metering unit formed by the measuring transducer, which detects the measuring voltage differentially, amplifies it and converts it from analog to digital. The digital values can be further processed by a microprocessor, which, for example, is part of the control circuit. In addition, additional electrical values can be calculated. The electrical values can be stored locally and/or transmitted as a data stream to an external storage device, for example a network storage device (for example, Cloud). The refinement according to the invention provides at least the following advantages: The configurable input circuit allows for the use of current transformers providing an output current signal or output voltage signal in one device. Due to the configurable input circuit, no incorrect selection of the device with regard to the current transformers used is possible. Only one electronic switch is required for each configurable input circuit. The two anti-serial electronic switches, as used in the prior art, are not required, which reduces the power dissipation and the influence of thermal effects on the measuring circuit. An analog filter circuit can be configured depending on the type of current transformer used and is dimensioned in such a way that temperature influences in the operating temperature range do not cause any notable measurement deviations within the measuring tolerance. By selecting a suitable MOSFET, no additional level conversion is required for the control of the electronic switches. This reduces the number of components and the power dissipation. The output voltage of voltage-supplying current transformers which are either not connected or connected to a high-impedance load is also limited if the device is not supplied with energy, which prevents the destruction of the device. This can be done by means of an external power supply, such as a battery or rechargeable battery. However, the device can also be powered by a mains voltage, wherein this voltage is then supplied externally, and preferably not obtained from the power to be measured. The device is supplied with energy independently of the grid to be analyzed or the load to be analyzed, which prevents their electrical influence. The measurement and authorization data can be transmitted to a network storage device, for example a Cloud. Subsequent evaluation and long-term storage for documentation purposes is possible. In addition, miniaturization is possible, as the full functionality is preferably located in one device. The device can be designed in modules.

BRIEF DESCRIPTION OF THE DRAWINGS

Exemplary embodiments of the invention are explained below on the basis of the attached drawings. In the drawings.

DETAILED DESCRIPTION

Figure 1:
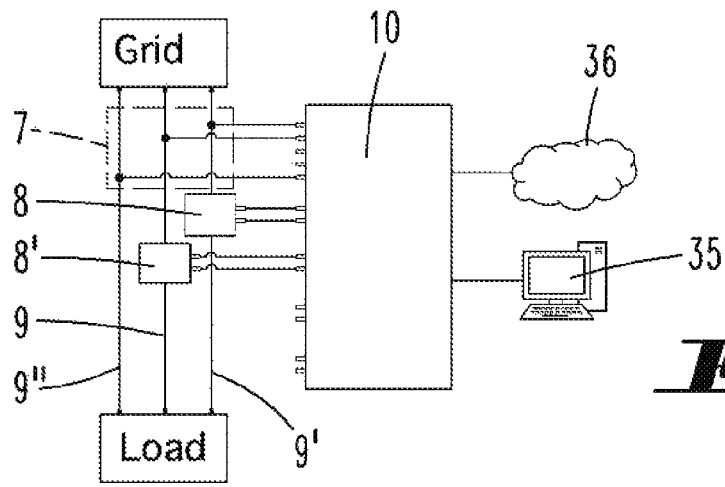
FIG. 1 illustrates a block diagram of an energy metering terminal 10 connected to a single-phase grid, wherein the energy metering terminal 10 is additionally connected to an external memory 36 or an external data-processing device 35.
Figure 2:
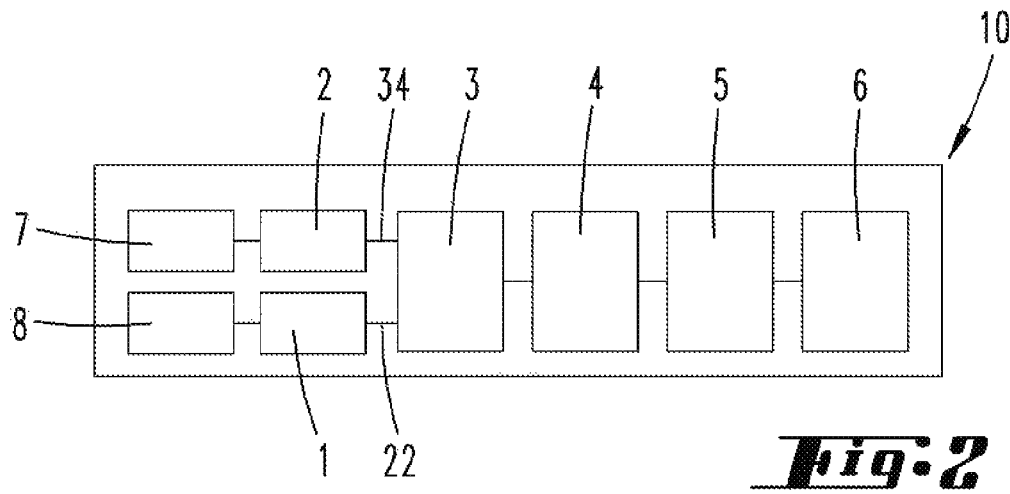
FIG. 2 illustrates a block diagram of the energy metering terminal 10.

FIGS. 1 and 2 are a rough diagram of an energy metering terminal 10, as it is used for measuring power or energy flowing through an electrical supply line. FIG. 1 shows a single-phase grid. However, a current and a voltage can also be tapped in an analogous manner at the two further phases of a three-phase grid, and thus at each of the three phases.

Current transformers 8 are located in each of the three phases L1, L2, L3. Note, FIG. 1 shows only the phase L1, identified by reference numeral 9. The current transformers supply signals proportional to the current flowing through the phases L1, L2, L3. These signals can be currents or voltages, depending on whether a transformer or, for example, a Rogowski coil is used as a current transformer 8. FIG. 1 shows an optional current transformer 8, which is also looped into the neutral conductor N, identified by reference numeral 9'.

Figure 6:
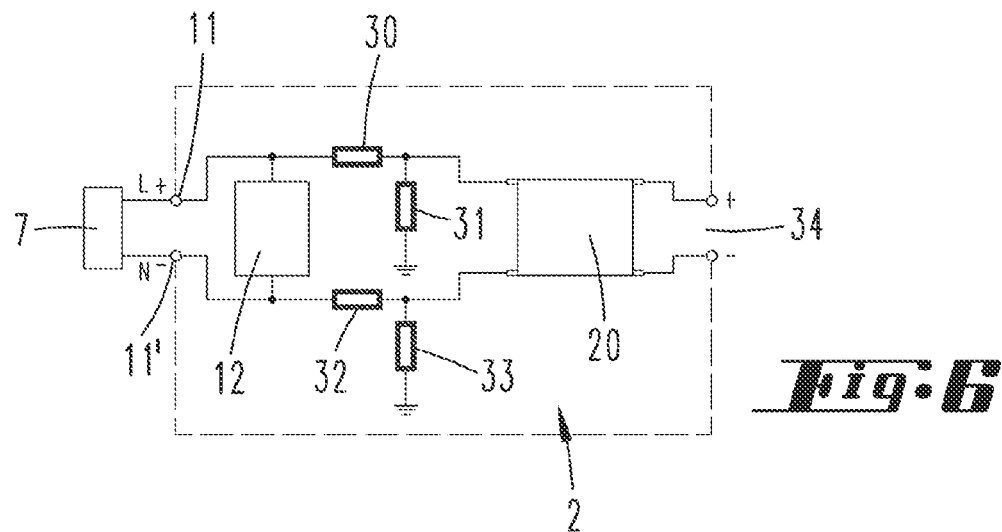
FIG. 6 illustrates an embodiment of a voltage measuring circuit 2.

Voltages between the neutral conductor 9' and the phase 9 are measured, either by direct connection or by using voltage transformers 7. The reference numeral 2 denotes a voltage measuring circuit which measures the voltage tapped directly by means of the optional voltage transformer 7 and converts it into a measuring voltage. FIG. 6 shows an exemplary embodiment.

Figure 3:
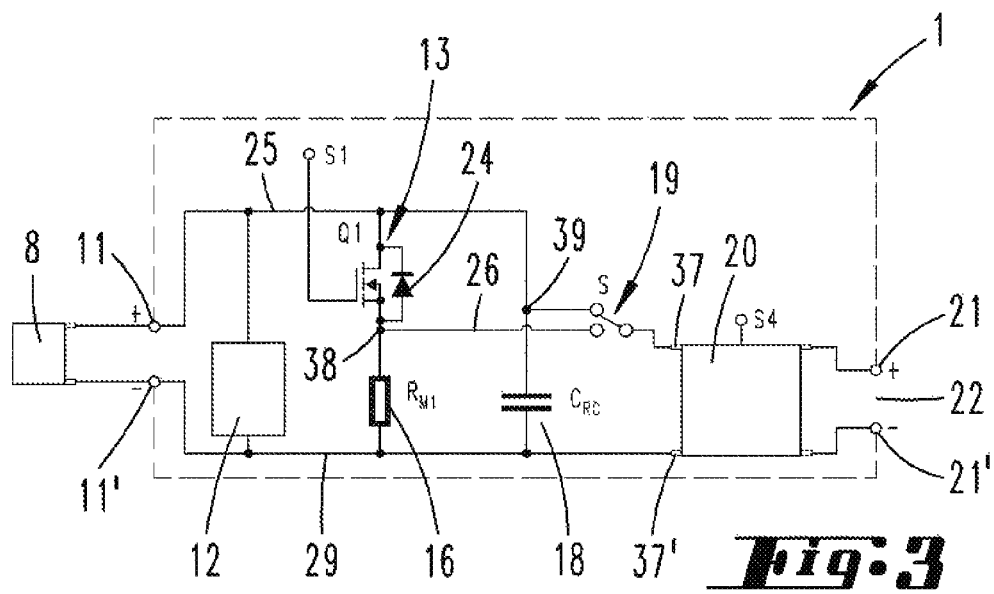
FIG. 3 illustrates a first embodiment of a current measuring circuit 1.
Figure 4:
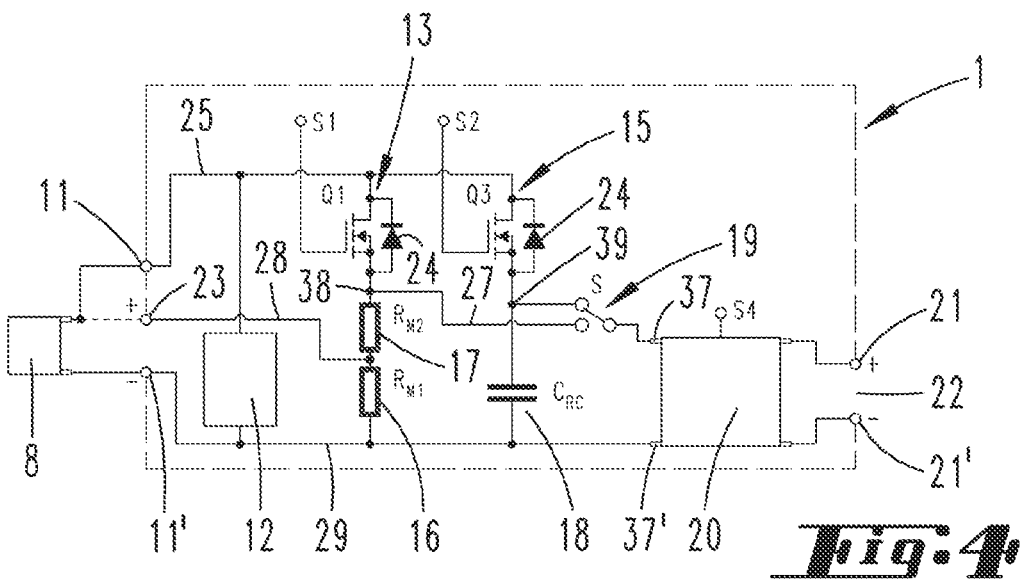
FIG. 4 illustrates a second embodiment of a current measuring circuit 1.
Figure 5:
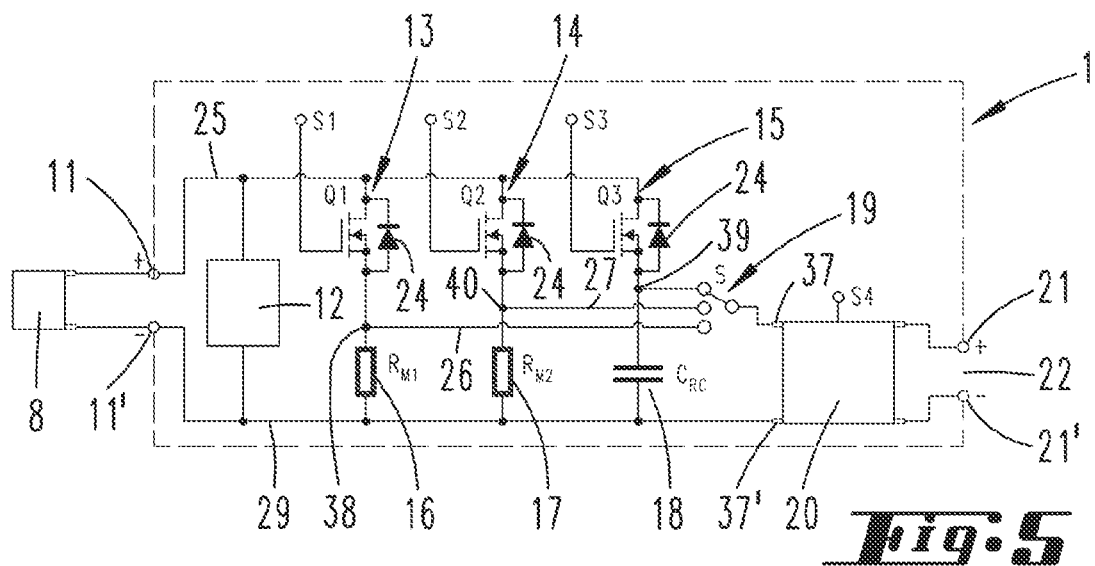
FIG. 5 illustrates a third embodiment of a current measuring circuit 1.

The reference numeral 1 denotes a current measuring circuit which converts the signals emitted by the current transformer 8 into measuring voltages. FIGS. 3 to 5 show exemplary embodiments of the current measuring circuit 1.

Reference numeral 3 denotes a measuring transducer, for example, a voltage measuring device or energy metering unit commercially available as an integral circuit. This energy metering unit is used to correlate the measuring voltages obtained from the current measuring circuit 1 and the voltage measuring circuit 2, which can be DC voltages, but preferably are AC voltages. This is done for determining, for example, an active power, an apparent power or a power factor. This data is further processed as digital data in a microcontroller, which is embodied by a control device 4, or which embodies a control device 4. The captured data are routed to a communication interface 6 via a galvanic isolation in the form of an insulation device 5. The communication interface 6 forwards the data to an external data storage device 36 or to an external data-processing device 35. The insulation device 5 can also be arranged between the measuring transducer 3 and the microcontroller 4.

FIG. 3 shows a first embodiment of a measuring circuit according to the invention. Depending on the design, a current transformer 8 provides either a current proportional to the current flowing through one of the conductors 9, 9', or a voltage proportional to the same. This current or voltage signal is tapped at the output terminals of the current transformer 8. The output terminals of the current transformer are connected to input terminals 11, 11' of the current measuring circuit 1. A surge protection circuit 12 is located between the two input terminals 11, 11'. If the current transformer 8 provides a voltage, the surge protection circuit 12 ensures that this voltage does not exceed an upper threshold value when the secondary side of the input terminals 11, 11' is in high impedance. The surge protection circuit 12 can operate in the manner of a Zener diode. The surge protection circuit 12, which works similar to a Zener diode, is connected between the input terminals 11, 11'.

The output 22 of the current measuring circuit 1 is connected to the input terminals 21, 21' of a voltage measuring device 3, which is not shown in FIG. 3 for the sake of clarity. The current measuring circuit 1 has output terminals 37, 37', which are connected to the input terminals 21, 21' via a filter 20. The filter is a single-stage, two-stage, or multi-stage low-pass filter. The output terminal 37' can be directly connected to the input terminal 11'.

A measuring resistor 16, which has a low resistance value, can be brought into contact with the input terminals 11, 11' by means of a switch 13 formed by a MOSFET, such that the current supplied by the input terminals 11, 11' flows through the switch 13 and the measuring resistor 16. A measuring point 38 is formed by a node between the measuring resistor 16 and the switch 13. A voltage is tapped at this location. This is done by means of the connecting line 26, which connects the node to the filter 20 via the changeover switch 19 and to the output terminal 37 via the filter 20. The voltage measuring device 3 now measures the voltage drop directly at the measuring resistor 16.

The measuring resistor 16 is dimensioned such that the voltage drop at the body diode 24 of the MOSFET 13 is lower than the forward voltage of the body diode 24 of the MOSFET 13.

If a voltage supplied by the input terminals 11, 11' is to be measured by the current measuring circuit 1, then the changeover switch 19 is switched by the control device 4, such that it connects the switching contact arranged at the top of FIG. 3 with the common contact of the changeover switch 19. Now a signal S1, which blocks the MOSFET 13, is present at the gate of the MOSFET 13. The changeover switch 19 has now connected the filter 20 or the output terminal 37 directly to the input terminal 11, such that the voltage measuring device 3 (not shown) measures the voltage present at the input terminals 11, 11'.

A capacitor 18 has a low capacitance and is connected between the upper switching contact or the input terminal 11 and the input terminal 11' to short-circuit high-frequency alternating currents. The capacitance of the capacitor 18 is so low that the value measured at the measuring resistor 16 during the current measurement is not distorted.

The exemplary embodiment shown in FIG. 4 has an additional switch 15, which can be used to alternatively connect the capacitor 18 or the upper switching contact of the changeover switch to the input terminal 11 via the connecting line 25. The switch 15 is preferably also a MOSFET. The switching signal S2 can be provided by the control device 4. The switch 15 is conductive only if the changeover switch 19 is connected to the switch 15, i.e., if the voltage present at the input terminals 11, 11' is to be measured. This measuring resistor arrangement consists of two measuring resistors 16, 17 connected in series. The current supplied by the current transformer 8 can alternatively only flow through a measuring resistor 16 or simultaneously through both measuring resistors 16, 17, wherein the measuring voltage is tapped at the measuring point 38.

The circuit shown in FIG. 4 can be connected to a current transformer 8 in various ways. To measure a current range up to, for example, a maximum of 1 A, the input terminal 11 is connected to the connecting line 25, which connects the input terminal 11 to the switch 13. If the switch 13 is conductive, the current flows through two measuring resistors 17, 16 connected in series, which in turn are connected in series with the switch 13. A measuring voltage can be tapped at the measuring point 38 between the switch 13 and the measuring resistor 17 via a connecting line 27. The measuring voltage is also present at the output terminal 37 via the lower switching contact, which by means of the changeover switch 19 is brought into a conductive connection with the common contact of the changeover switch 19.

If, on the other hand, a current range up to, for example, a maximum of 5 A is to be measured, the input terminal 11 is brought into electrically conductive contact with the terminal 23, such that the current supplied by the input terminals 23, 11' flows only through the measuring resistor 16 via the connecting line 28. The voltage is then measured at the measuring point 38 when switch 13 is in a blocking state; this voltage drops across the measuring resistor 16 due to the current through the same, and it is conducted to the measuring point 38 via the measuring resistor 17, wherein the voltage drop across the resistor 17 is negligible. With the switch 13 in a blocking state, the voltage drop across the measuring resistor 16 and 17 is measured at the measuring point 38. Herein, the voltage drop across the measuring resistor 17 is negligible, as the current flows primarily through the measuring resistor 16. By connecting the lower switching contact to the common contact of the changeover switch 19, the voltage across the input terminals 21, 21' can be measured by the voltage measuring device 3.

In the circuit shown in FIG. 5, a range switching is realized by two arrangements, each having a switch 13, 14 and a measuring resistor 16, 17. The two arrangements are connected in parallel between the input terminals 11, 11'. Each arrangement has a measuring point 38, 40 arranged between the switch 13, 14 and the measuring resistor 16, 17, wherein at the measuring point 38, 40 a measuring voltage dropping across the measuring resistor 16, 17 can be tapped by means of a connecting line 26, 27. For this purpose, only one of the connecting lines 26, 27 is connected to the input terminal 21 of the output 22 via the changeover switch 19 and the filter 20.

The switches 13, 14 and the changeover switch 19 are actuated together in this exemplary embodiment as well. If the changeover switch 19 connects the common contact to the switching contact connected to the connecting line 27, the switch 14 is conductive and the switch 13 is in a blocking state. Likewise, a further switch 15, which connects the input terminal 11 to a capacitor 18, is in a blocking state. The voltage drop across the measuring resistor 17 is measured. If, however, the changeover switch 19 connects the common contact to the switching contact connected to the connecting line 26, the switch 13 is conductive and the switches 14 and 15 are in a blocking state. Now, the voltage drop across the measuring resistor 16 is measured.

Again, the measuring resistors 16, 17 are dimensioned such that the voltage drops across the body diodes 24 of the MOSFET forming the switches 13, 14 is lower than the forward voltage of the body diode 24 of the MOSFETs 13 and 14.

A load is connected to the current transformers 8, which are used for measuring current, by means of the input circuit which is configurable according to the invention. Herein, a separate load path is connected for each current transformer type by means of an N-channel MOSFET 13, 14. In exemplary embodiments of the invention, each of the three phases L1, L2, L3 can interact with a circuit according to FIGS. 3 to 5. Current transformers 8, which are designed as transformers, are connected to low-impedance loads. Current transformers 8 designed as Rogowski coils, for example, are connected to high-impedance loads. For this purpose, the capacitor 18 in the exemplary embodiments has a sufficiently low capacitance and is connected to the input terminal 11 by means of a separate switch 15 according to the embodiments in FIGS. 4 and 5. This is carried out along with an electrically conductive connection of the output terminal 37 or the input terminal 21 to the input terminal 11. The MOSFETs are selected such that their drain-source resistance is sufficiently low in the activated state and at the same time is sufficiently high in the deactivated state. The impedance of the load path is so low that no notable heating of the MOSFET is caused by the current flowing through it. In the case of voltage measurement, the load is of such high impedance that no load is placed on the energized output of the current transformer supplying a voltage, and thus no notable impact on the output signal to be measured is created. The components according to the invention are matched to each other such that measurement distortion is minimized. This is especially due to the fact that the magnitude of the measuring signals is smaller than the forward voltages of the body diodes of the MOSFETs. At the same time, the body diodes 24 act as protective elements when misconfigurations occur and protect downstream circuit paths. Furthermore, the MOSFET used herein has a body diode 24 in the respective load path, which becomes conductive when the absolute value of the negative input voltage is too high and, in this case, limits the maximum absolute value of the negative measuring voltage at the output of the current transformer. At the same time, the body diode 24 has a sufficiently high forward voltage, such that direct and alternating current signals, and thus the maximum measuring voltage to be detected at the output of the current transformers, are not affected. In addition, the output voltage of the current transformers is limited to a reasonable value for the downstream measuring circuit by means of a voltage limiting circuit or surge protection circuit 12 at the input of the current measuring channel. Electronic switches are used for the configurable filter circuit 20, which realize the connection to the currently used load path. In addition, these switches have a sufficiently low impedance in the activated state, which across the entire operating temperature range has no notable effect on the measuring signal to be filtered.

The measuring point 39, with which the output terminal is in a galvanically conductive connection when the voltage present at the input terminals 11, 11' is to be measured, is either permanently connected to the input terminal 11 in an electrically conductive manner or alternatively can be connected with the input terminal 11 in an electrically conductive manner by means of a switch 15. In exemplary embodiments not shown here, which are variants of the embodiments shown in FIGS. 3, 4, and 5, a diode connected antiparallel to the body diode 24 can be added to the surge protection device 12.

The communication interface 6 can be a wired interface or a wireless interface (Modbus, USB, CAN, I2C, SPI and the like are also possible). The ability to access the measurement data is essential to the communication interface 6. Measured and/or calculated values can be transferred to a higher-level unit, for example a data storage device 36 or a data-processing device 35, by means of the interface. However, a parameterization of the measuring circuit or the energy metering terminal can also be carried out via the communication interface 6.

The insulation device 5 provides a galvanic isolation. The galvanic isolation is carried out without an additional oscillator signal by means of planar magnetic or optical insulation elements.

FIG. 6 shows a voltage measuring circuit 2, by means of which one of the voltages between the conductors 9, 9', 9" shown in FIG. 1 can be measured. Again, a surge protection circuit 12 is provided between the two output terminals of the voltage transformer 7. Two voltage divider circuits 30, 31; 32, 33 are provided. The voltage divider circuit 30, 31 is formed by at least two resistors, one of which is connected to an input terminal 11 of the voltage transformer 7 and another to ground. A voltage is tapped at the node. The voltage divider circuit 32, 33 is designed symmetrically, but is optional. Here, too, a voltage is tapped at the node and the resistor 33 is connected to ground. A filter 20 is provided for filtering out high-frequency interference signals. If the voltage divider circuit 32, 33 is not used, the input terminal 11' is connected directly to ground. The measuring transducer 3 is connected to the secondary side of the filter 20 via the output 34, wherein on the primary side of the filter 20 the two tapped voltages are present.

The aforementioned statements are intended to explain the inventions covered by the application overall, which also independently refine the prior art at least by the following combinations of features, wherein two, multiple or all of these combinations of features may also be combined, specifically:

A measuring circuit, which is characterized by a changeover switch 19 which can be used to connect one of the output terminals 37 of the output terminal pair 37, 37' to the first measuring point 38 in the current measuring position, and to a second measuring point 39 in the voltage measuring position.

A measuring circuit characterized by a second switch 14, which in the current measuring position connects a second measuring resistor 17 between the input terminals 11, 11' in such a way that a current-dependent measuring voltage present at a third measuring point 40 of the second measuring resistor 17 can be tapped.

A measuring circuit characterized in that the changeover switch 19 alternatively brings the output terminal 37 into a conductive connection to the first measuring point 38, the second measuring point 39 or a third switch 24 which in a conductive state connects the input terminal 11 to the output terminal 37, and/or characterized in that the changeover switch 19 connects the output terminal 37 directly to the input terminal 11 and/or characterized in that the third switch 24 in a conductive state connects the two input terminals 11, 11' to a capacitor 18 which is also connected between the output terminals 37, 37'.

A measuring circuit characterized in that at least one of the first, second or third switches 13, 14, 15 is a semiconductor switching element, for example, a MOSFET.

The measuring circuit characterized in that the first or second measuring resistor 16, 17, which is connected in series with the first or second switch 13, 14, each of which is designed as a MOSFET, is dimensioned such that the voltage drop across the MOSFET 13, 14 connected in series with the switch in question, or the MOSFET 13, 14 connected in series with another measuring resistor 16, 17, is lower than the forward voltage of the body diode 24 of the MOSFET 13, 14.

A measuring circuit characterized in that a filter 20 is connected between the output terminals 37, 37' and input terminals 21, 21' of a voltage measuring device 3 which can be used to measure the voltage present at the output terminals 37, 37'.

A measuring circuit characterized in that two measuring resistors 16, 17 are connected in series with the first switch 13 and characterized in that the first measuring point 38 is located between the first switch 13 and the two measuring resistors 16, 17, wherein a connecting line 28 to the connection node of the two measuring resistors 16, 17 can alternatively be connected to the output terminal of the current transformer 8 instead of a connecting line 25 to the third switch 15 or to the changeover switch 19.

An energy metering terminal characterized in that the current measuring circuit 1 is a measuring circuit according to the claims.

An energy metering terminal characterized in that the voltage measuring circuit 2 has at least one voltage divider 30, 31 at which the measuring transducer 3 taps a voltage and/or characterizes in that the control device 4 switches at least one of the first switch 13, second switch 14 or third switch 15 synchronously with the changeover switch 19.

All disclosed features are (in themselves, but also in combination with each other) essential to the invention. The disclosure of the application hereby also fully incorporates the disclosures contained in the related/attached priority documents (copy of the prior application), including for the purpose of including features of those documents in claims of the present application. The features listed in dependent claims, even without the features of a referenced claim, characterize independent inventive refinements of the prior art, in particular in order to file divisional applications on the basis of these claims. The invention specified in each claim may additionally have one or more of the features specified in the above description, in particular features denoted with reference numerals and/or specified in the list of reference numerals. The invention also relates to designs in which some of the features mentioned in the above description are not realized, in particular insofar as they are clearly expendable for the respective purpose of use or can be replaced by other technically identical means.

The invention claimed is:

1. A measuring circuit which can be connected to a current transformer for determining the magnitude of a current flowing through a conductor, the measuring circuit having an input terminal pair which can be connected to the current transformer, with a first switch, which connects a measuring resistor between the input terminals in a current measuring position, and which, in a voltage measuring position, separates the measuring resistor from at least one of the input terminals, and having an output terminal pair, at which, alternatively, a voltage-dependent measuring voltage present at the input terminal pair or a current-dependent measuring voltage present at a first measuring point of the measuring resistor can be tapped, characterized by a changeover switch, which can be used to connect one of the output terminals of the output terminal pair to the first measuring point in the current measuring position, and to a second measuring point in the voltage measuring position,
    wherein the changeover switch alternatively brings the output terminal into a conductive connection to the first measuring point, the second measuring point or a third switch which in a conductive state connects the input terminal to the output terminal.

2. The measuring circuit according to claim 1, characterized by a second switch, which in the current measuring position connects a second measuring resistor between the input terminals in such a way that a current-dependent measuring voltage present at a third measuring point of the second measuring resistor can be tapped.

3. The measuring circuit according to claim 1, wherein the third switch in a conductive state connects the two input terminals to a capacitor which is also connected between the output terminals.

4. The measuring circuit according to claim 1, wherein at least one of the first, second or third switches is a semiconductor switching element, for example, a MOSFET.

5. The measuring circuit according to claim 1, wherein the first or second measuring resistor, which is connected in series with the first or second switch, each of which is designed as a MOSFET, is dimensioned such that the voltage drop across the MOSFET connected in series with the switch in question, or the MOSFET connected in series with another measuring resistor, is lower than the forward voltage of the body diode of the MOSFET.

6. The measuring circuit according to claim 1, wherein a filter is connected between the output terminals and input terminals of a voltage measuring device which can be used to measure the voltage present at the output terminals.

7. An energy metering terminal having a voltage measuring circuit which can be connected to a voltage transformer or directly to a conductor and a neutral conductor, having a current measuring circuit which can be connected to a current transformer, having a measuring transducer with a voltage measuring device for measuring the voltage measured by the voltage measuring circuit and the current measuring circuit and its phase angle for determining electrical power parameters, and having a control circuit and a communication interface,
    wherein the current measuring circuit has an input terminal pair which can be connected to the current transformer, with a first switch, which connects a measuring resistor between the input terminals in a current measuring position, and which, in a voltage measuring position, separates the measuring resistor from at least one of the input terminals, and having an output terminal pair, at which, alternatively, a voltage-dependent measuring voltage present at the input terminal pair or a current-dependent measuring voltage present at a first measuring point of the measuring resistor can be tapped, characterized by a changeover switch, which can be used to connect one of the output terminals of the output terminal pair to the first measuring point in the current measuring position, and to a second measuring point in the voltage measuring position, and
    wherein the changeover switch alternatively brings the output terminal into a conductive connection to the first measuring point, the second measuring point or a third switch which in a conductive state connects the input terminal to the output terminal.

8. The energy metering terminal according to claim 7, wherein the voltage measuring circuit has at least one voltage divider at which the measuring transducer taps a voltage.

9. The energy metering terminal according to claim 7, wherein the control circuit switches at least one of the first switches, second switches or third switches synchronously with the changeover switch.

* * * * *